United States Patent [19]

Castleman

[11] 4,201,654
[45] May 6, 1980

[54] ANODE ASSISTED SPUTTER ETCH AND DEPOSITION APPARATUS

[75] Inventor: B. Wayne Castleman, Kenneth City, Fla.

[73] Assignee: The United States of America as represented by the Secretary of the Air Force, Washington, D.C.

[21] Appl. No.: 949,167

[22] Filed: Oct. 6, 1978

[51] Int. Cl.$^2$ .............................................. C23C 15/00
[52] U.S. Cl. ................................. 204/298; 204/192 R; 204/192 E
[58] Field of Search ................. 204/192 R, 298, 192 E

[56] References Cited

U.S. PATENT DOCUMENTS

| | | | |
|---|---|---|---|
| 3,451,917 | 6/1969 | Moseson | 204/298 |
| 3,487,000 | 12/1969 | Hajzak | 204/298 |
| 3,507,774 | 4/1970 | Muly, Jr. | 204/298 |
| 3,583,899 | 6/1971 | Aronson | 204/298 |
| 3,669,871 | 6/1972 | Elmgren et al. | 204/298 |
| 3,836,451 | 9/1974 | Snaper | 204/298 |
| 4,013,533 | 3/1977 | Cohen-Solal et al. | 204/192 S |
| 4,096,055 | 6/1978 | Johnson | 204/298 |

OTHER PUBLICATIONS

L. I. Maissel and R. Glang; *Handbook of Thin Film Technology*; McGraw Hill, 1970; Chapter 4 pp. 4–1 through 4–9.
L. I. Maissel; *Physics of Thin Films*, vol. 3, Academic Press, 1966.

Primary Examiner—John H. Mack
Assistant Examiner—William Leader
Attorney, Agent, or Firm—Joseph E. Rusz; Jacob N. Erlich

[57] ABSTRACT

An anode assisted sputter etch and deposition apparatus having an electron source, a first anode adjacent the electron source and a second anode adjacent a negatively charged article to be sputter etched or sputter target in an ionizable gas atmosphere. Upon production of the electrons from said electron source a plasma is formed between the electron source, the first anode and the second anode, the plasma adjacent the second anode being capable of desorbing gases and other absorbed vapors from the surface of the article or target while positive ions from the plasma bombard the article or target with sufficient energy to eject material from the surface thereof.

9 Claims, 3 Drawing Figures

ANODE ASSISTED SPUTTER ETCH AND DEPOSITION APPARATUS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to sputter etch and deposition systems, and, more particularly to an etch and deposition apparatus which incorporates therein a centrally located anode in order to assist in the sputtering operation when utilized with concave surfaces.

In recent years the demand in the electronics industry, for example, for films with qualities difficult or even impossible to attain by deposition techniques already available, has led to the utilization of sputtering as a method of depositing a thin film coating on a surface. In addition, the sputtering technique has been utilized for the cleaning and etching of surface contaminants or other layers of material which are not desired from the surface of an article.

Unfortunately, a basic problem still exists in the sputter cleaning of the inside of a small hemispherical cavity. The standard technique for sputter cleaning was simply to apply a negative bias to the article to be cleaned in a glow discharge or plasma. It was then discovered that because of the shape of the cavity and its small size that the effectiveness of the sputtering technique decreased greatly when the effective diameter of the concave surface of the cavity is of the order of the Crookes dark space or smaller. For example, such sputter cleaning techniques of the past were relatively ineffective in cleaning the interior of a hemispherical cavity of ⅜ inches in diameter. Consequently, it can be seen that past sputter cleaning techniques utilized with articles having concave surfaces require substantial improvement to be effective.

SUMMARY OF THE INVENTION

The instant invention overcomes the problems encountered in the past by providing an anode assisted sputter etch and deposition apparatus which is capable of uniformly applying a bombarding plasma to the interior of a concave surface for the purpose of plasma cleaning which results in the removal from the surface of any contaminants or other layers of material which are not desired on the surface which may inhibit other processes such as the deposition of other material on the surface. In addition, the instant invention can be utilized for altering the size and shape or patterns of the concave surface by sputter etching the surface with the plasma until the desired size and shape or pattern are obtained. Furthermore, the instant invention can be utilized in conjunction with a conventional deposition process for the purpose of applying a voltage bias to the entire surface thereby causing the removal of gaseous impurities from the surface as well as permitting better adhesion to take place during the deposition process. In addition, the instant invention is capable of using the concave surface as a sputter target wherein the material is removed from the surface and deposited onto a nearby substrate, thereby forming a coating on the substrate.

The sputter etch and deposition apparatus of this invention is made up of a housing which is capable of having a partial vacuum formed therein. A heated filament located within the housing provides a source of electrons in an argon or other suitable atmosphere at this partial vacuum. The electrons are accelerated toward an anode located within the housing and upon colliding with an atmospheric gas, such as argon, forms a plasma which consists of positive and negative ions and electrons.

The concave surface of an article to be cleaned by the instant invention is secured in position by a holder intermediate the heated filament and anode while a negative voltage bias is applied to it. A positive electrode in the form of an anode pin is centrally located within the concave surface. The positive potential on the anode pin utilizes part of the available ions to form a plasma within the concave cavity, which in itself is effective in desorbing gases and other absorbed vapors from the surface. The negative potential applied to the concave surface attracts the positive ions of the plasma which then bombards the surface with sufficient energy to eject materials from the surface.

The present invention has the advantage that a plasma is created within the cavity and that the Crookes dark space is established between the centrally located anode pin and the surface to be cleaned. Bombarding action takes place within the entire cavity. As a result thereof the present invention can plasma clean or etch smaller parts than was possible in the past, and can more uniformly clean or etch larger parts.

It should also be realized that the present invention is not limited to merely the cleaning of concave surfaces, in that it can be used to change the size and shape of any surface by small controllable amounts by continuing to sputter etch the surface as long as desired. Such a system may also be used to form patterns or grooves in the surface, which could not be accomplished with prior art techniques. Furthermore, the instant invention has the advantage that it can be used in conjunction with a conventional deposition process to apply an effective bias to the entire surface when it is desired to bias sputter-deposit material onto the surface. Past attempts at such a procedure generally would not uniformly apply the bias to the surface and the deposited coating would not have the same uniformity and characteristics over the entire surface.

In addition, since the instant invention can effectively remove material from the concave surface of an article, it follows that this removed material can be utilized for the purpose of deposition onto a nearby substrate in a deposition operation. In this mode of operation the hemispherical cavity becomes a small sputtering target. Since the plasma is mostly contained within the cavity substantial reduction can be made in substrate heating, a considerable advantage over small flat targets of the past.

It is therefore an object of this invention to provide a sputter etch and deposition apparatus which incorporates therein a centrally located anode for the purpose of effectively removing material from a concave surface.

It is another object of this invention to provide an anode assisted sputter apparatus capable of effectively depositing material on an adjacent substrate.

It is a further object of this invention to provide an anode assisted sputter apparatus capable of altering the size and shape of a surface by small controllable amounts.

It is still a further object of this invention to provide an anode assisted sputter etch and deposition apparatus which is economical to produce and which utilizes conventional, currently available components that lend themselves to standard, mass producing, manufacturing techniques.

For a better understanding of the present invention, together with other and further objects therein, reference is made to the following description taken in conjunction with the accompanying drawing and its scope will be pointed out in the appended claims.

DETAILED DESCRIPTION OF THE DRAWING

DETAILED DESCRIPTION OF THE PREFERRED EMBODIMENT

Figure 1:
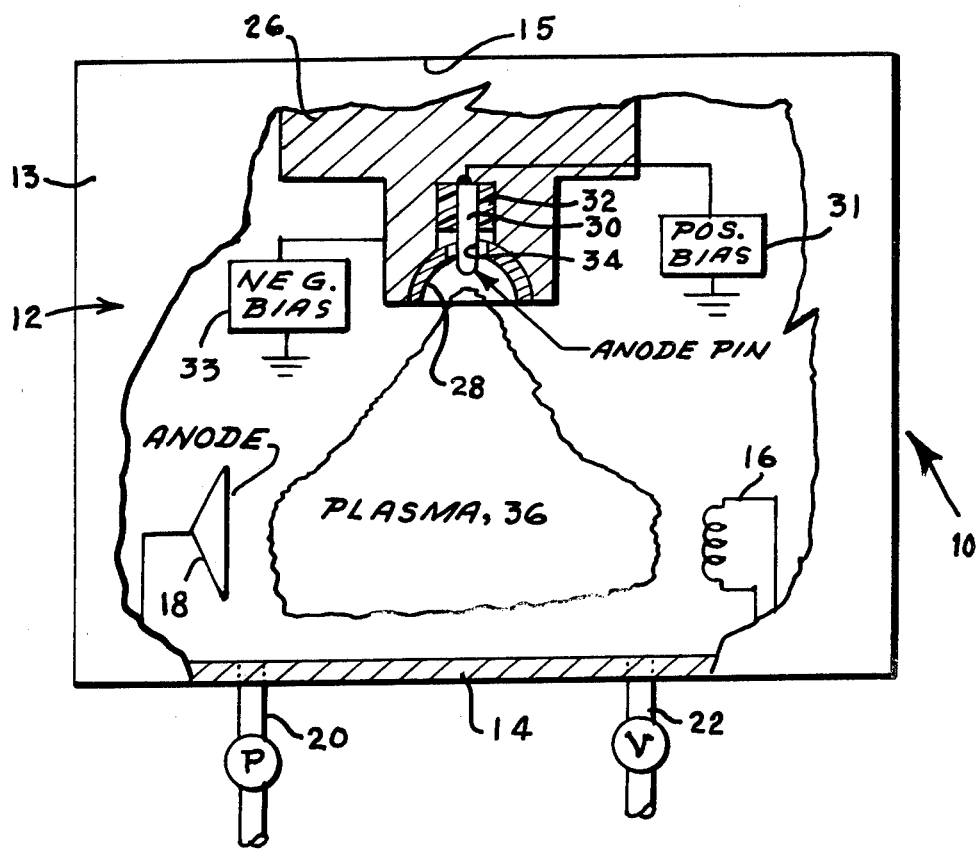
FIG. 1 is schematic representation of the anode assisted sputter etch apparatus of the instant invention and shown partly in cross section.

Reference is now made to FIG. 1 of the drawing which illustrates in schematic fashion the anode assisted sputter etch apparatus 10 of this invention. Apparatus 10 is made up of a housing 12 having side walls 13 and base and cover plates 14 and 15, respectively, which form therein a vacuum chamber. Located at opposite ends of housing 12 and secured, as shown, to base plate 14 or to side walls 13 is a source of electrons, produced by, for example, a conventional heating filament 16, and an anode 18, respectively.

The various inputs and outputs to housing 12 are made at base 14 and are in the form of a duct 20 operably connected to a vacuum pump (not shown) and a duct 22 for admitting an inert ionizable gas such as argon into the housing chamber. Other connections (not shown) are made through cover or base plates 14 and 15, respectively, for electrical conductors supplying the required energizing potentials and controls and for any suitable cooling apparatus, if needed, within housing 12.

Fixedly secured to cover plate 15 of housing 12 is a holder 26 which secures in any conventional manner such as by clamping therebeneath any article 28 which is to be sputter cleaned by the apparatus 10 of this invention. In addition, holder 26 incorporates therein a centrally located anode pin 30. In order to insulate anode pin 30 from holder 12, any suitable insulation such as ceramic insulation material 32 is interposed between holder 26 and anode pin 30. Any suitable positive bias source 31 is electrically connected to anode pin 30 while any suitable negative bias source 33 is either formed integral with or electrically coupled to holder 26 to provide a negative potential to holder 26.

For proper operation of the embodiment of the instant invention shown in FIG. 1 of the drawing, an aperture 34 should be centrally located within the article 28 to be cleaned in order to allow anode pin 30 to protrude therethrough. Furthermore, although not limited thereto, the sputter etch apparatus 10 of this invention is extremely effective on an article 28 to be cleaned having a hemispherical internal configuration.

Operation of the instant invention takes place by the evacuation of gas through duct 20 from within housing 12 and the controlled inlet of argon or any other suitable atmosphere which can be at a partial vacuum through duct 22. Heated filament 16 provides a source of electrons in the argon atmosphere and these electrons accelerate toward anode 18. Upon colliding with the atmospheric gas such as argon a plasma 36 is formed. Plasma 36 consists of positive and negative ions and electrons.

In addition, a positive potential is applied to anode 30 which utilizes part of the available ions to form an additional plasma within the concave cavity of article 28. This plasma in itself is effective in desorbing gases and other absorbed vapors from the surface of article 28. The negative potential which is applied to the surface of article 28 attracts the positive ions of the plasma which in turn bombards the inner surface of article 28 with sufficient energy to eject material from the surface in order to clean article 28.

Figure 2:
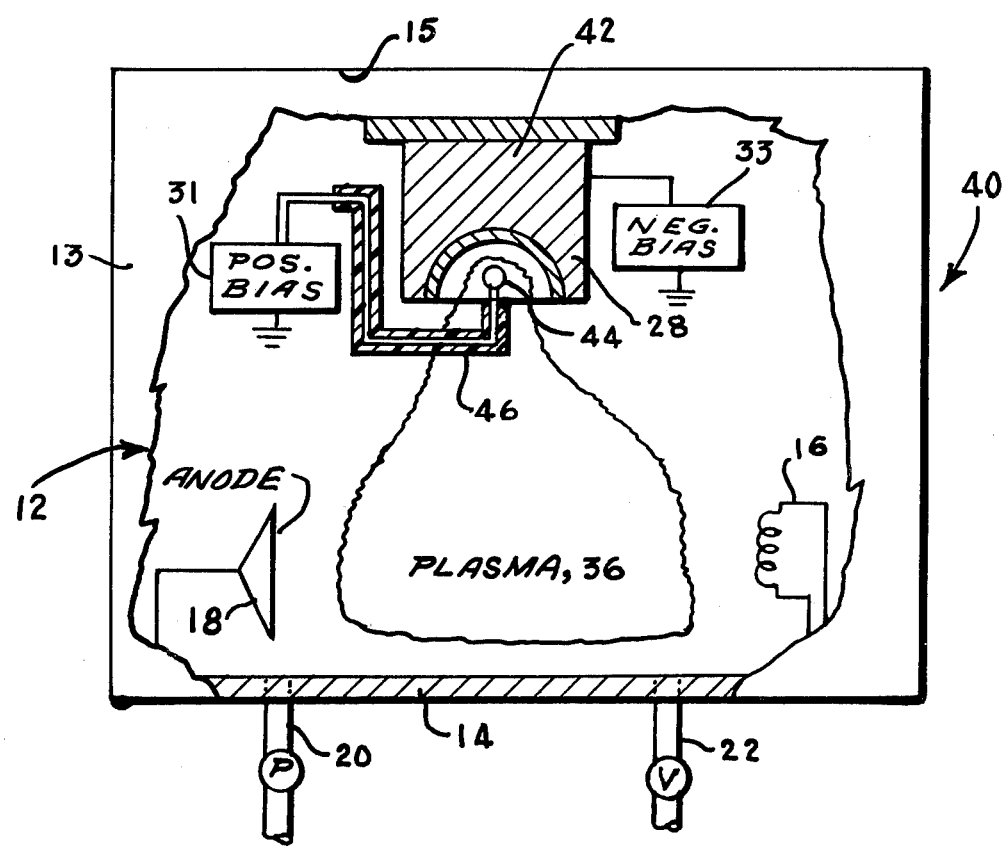
FIG. 2 is a schematic illustration of an alternate embodiment of the anode assisted sputter etch apparatus of this invention and shown partly in cross section.

Reference is now made to FIG. 2 of the drawing which illustrates in schematic fashion an alternate embodiment of the instant invention. Apparatus 40, illustrated in FIG. 2 of the drawing, utilizes many of the same elements of apparatus 10 and shown in FIG. 1 of the drawing. Consequently, for purposes of simplicity of understanding of the invention, those identical elements will be denoted by the same numeral used within FIG. 1.

The essential difference between apparatus 40, shown in FIG. 2, and apparatus 10 shown in FIG. 1, is that it is not required that the article 28 to be cleaned have a centrally located aperture therein. Since apparatus 40 of FIG. 2 utilizes in place of anode pin 34 a ball-shaped anode 44 which is disposed centrally within the undersurface of hemispherical article 28, holder 42 may be of solid construction. Ball-shaped anode 44 is held in this position by an insulated housing 46 thereby separating the positive potential of anode 44 from the negative potential applied to the article 28 to be cleaned. The operation of the anode assisted sputter etch apparatus 40 shown in FIG. 2 is otherwise identical to that of apparatus 10 shown in FIG. 1 of the drawing.

Figure 3:
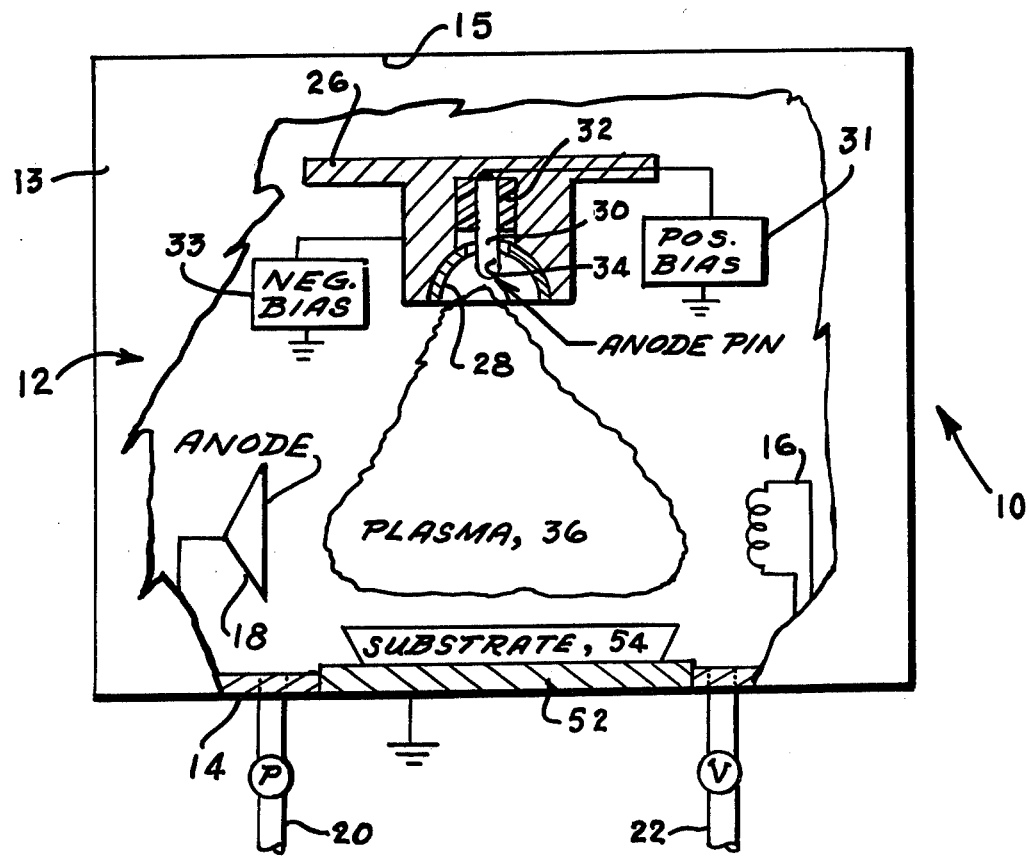
FIG. 3 is a schematic illustration of the anode assisted sputter deposition apparatus of the instant invention and shown partly in cross section.

As stated hereinabove, the sputter apparatus 10 or 40 of the instant invention is not limited merely to the cleaning or etching of surfaces, but can be utilized, if desired for the deposition procedure in which the sputter material from the article 28, is utilized for the purpose of depositing the material on a nearby substrate. To accomplish this end, reference is now made to FIG. 3 of the drawing which is identical to FIG. 1 of the drawing except for the addition of a substrate holder 52 and the positioning thereon of the substrate 54. Operation of the deposition apparatus set forth in FIG. 3 is identical to the operation of the etching apparatus 10 set forth in FIG. 1 with the additional procedure that the material removed from article 28 is now deposited upon the substrate 54. It should be further realized, although not shown in the drawing, that substrate holder 52 in conjunction with substrate 54 can be utilized with apparatus 40 shown in FIG. 2 of the drawing.

Although this invention has been described with reference to the particular embodiment, it will be understood to those skilled in the art that this invention is also capable of further and other embodiments within the spirit and scope of the appended claims.

I claim:

1. An anode assisted sputter etch apparatus comprising a housing, said housing forming a chamber therein, means located within said chamber for holding an article to be sputter etched, said holding means having a concave spherical configuration, said concave spherical configuration matingly engaging said article, means for introducing an ionizable gas into said chamber, means located within said chamber on one side of said holding means for producing electrons, a first anode located within said chamber on the other side of said holding means, means for providing a negative potential to said article, and a second anode located within said chamber being centrally located within said concave spherical configuration of said holding means adjacent said article and intermediate said first anode and said electron producing means whereby a plasma is formed between said electron producing means and said first and second anodes, said plasma adjacent said second anode being capable of desorbing gases and other absorbed vapors from the surface of said article while positive ions from said plasma bombard said article surface with sufficient energy to eject material therefrom.

2. An anode assisted sputter etch apparatus as defined in claim 1 wherein said holding means has a centrally located aperture therein, said second anode being located within said aperture and protruding from said holding means.

3. An anode assisted sputter etch apparatus as defined in claim 2 wherein said article is held in direct contact with said holding means and said negative potential applying means applies said negative potential to said holding means.

4. An anode assisted sputter etch apparatus as defined in claim 1 wherein said second anode is held in position adjacent said article by an insulated support.

5. An anode assisted sputter etch apparatus as defined in claim 4 wherein said article is held in direct contact with said holding means and said negative potential applying means applies said negative potential to said holding means.

6. An anode assisted sputter deposition apparatus comprising a housing, said housing forming a chamber therein, means located within said chamber for holding a sputter target, said holding means having a concave spherical configuration, said concave spherical configuration matingly engaging said sputter target, means for introducing an ionizable gas into said chamber, means located within said chamber on one side of said holding means for producing electrons, a first anode located within said chamber on the other side of said holding means, means for providing a negative potential to said sputter target, a second anode located within said chamber and centrally located within said concave spherical configuration of said holding means adjacent said sputter target and intermediate said first anode and said electron producing means and means for supporting a substrate intermediate said first anode and said electron producing means in alignment with said sputter target whereby a plasma is formed between said electron producing means and said first and second anodes, said plasma adjacent said second anode being capable of desorbing gases and other absorbed vapors from the surface of said sputter target while positive ions from said plasma bombard said sputter target with sufficient energy to eject material therefrom, said material being deposited on said substrate.

7. An anode assisted sputter deposition apparatus as defined in claim 6 wherein said holding means has a centrally located aperture therein, said second anode being located within said aperture and protruding from said holding means.

8. An anode assisted sputter deposition apparatus as defined in claim 7 wherein said sputter target is held in direct contact with said holding means and said negative potential applying means applies said negative potential to said holding means.

9. An anode assisted sputter deposition apparatus as defined in claim 6 wherein said second anode is held in position adjacent said sputter target by an insulated support.

* * * * *